Feb. 3, 1953 N. E. KLEIN 2,627,578

TUNABLE HIGH-FREQUENCY OSCILLATOR

Filed Nov. 14, 1945

INVENTOR.
Norman E. Klein
BY
[signature]
ATTORNEY

Patented Feb. 3, 1953

2,627,578

UNITED STATES PATENT OFFICE 2,627,578

TUNABLE HIGH-FREQUENCY OSCILLATOR

Norman E. Klein, Clemson, S. C., assignor to the United States of America as represented by the Secretary of the Navy Application November 14, 1945, Serial No. 628,601

6 Claims. (Cl. 250—36)

This invention relates to radio-frequency devices. An object is to provide an improved ultra-high-frequency oscillator and, more generally, a tunable resonator therefor and especially adapted to operate at frequencies of 100 megacycles per second and higher.

Various known types of oscillators employ lumped circuit constants for tuning and others utilize parallel lines, concentric lines and folded and reentrant cavity resonators. For good efficiency of a power stage in this part of the radio spectrum, lumped tuning elements are unsatisfactory, and use of distributed inductance and capacitance in the past has led either to tuning difficulties as to range and operating mechanism or to excessive bulk for certain frequencies, or to both.

Accordingly, a further object is to provide a compact and efficient resonator having a wide tuning range and a simple tuning arrangement.

In accomplishing the foregoing objects, a cavity resonator is employed enclosing and connected in series with an inductive loop that may be variously oriented in the cavity to adjust the mutual coupling between the cavity and the loop. When applied to oscillator construction, an adjustable inductor can be similarly used for developing and varying the excitation. Such oscillator has practically zero external stray field.

A better understanding of the invention will be gained from the following detailed description of a specific embodiment thereof, and from the drawings in which.

Figures 1, 2:
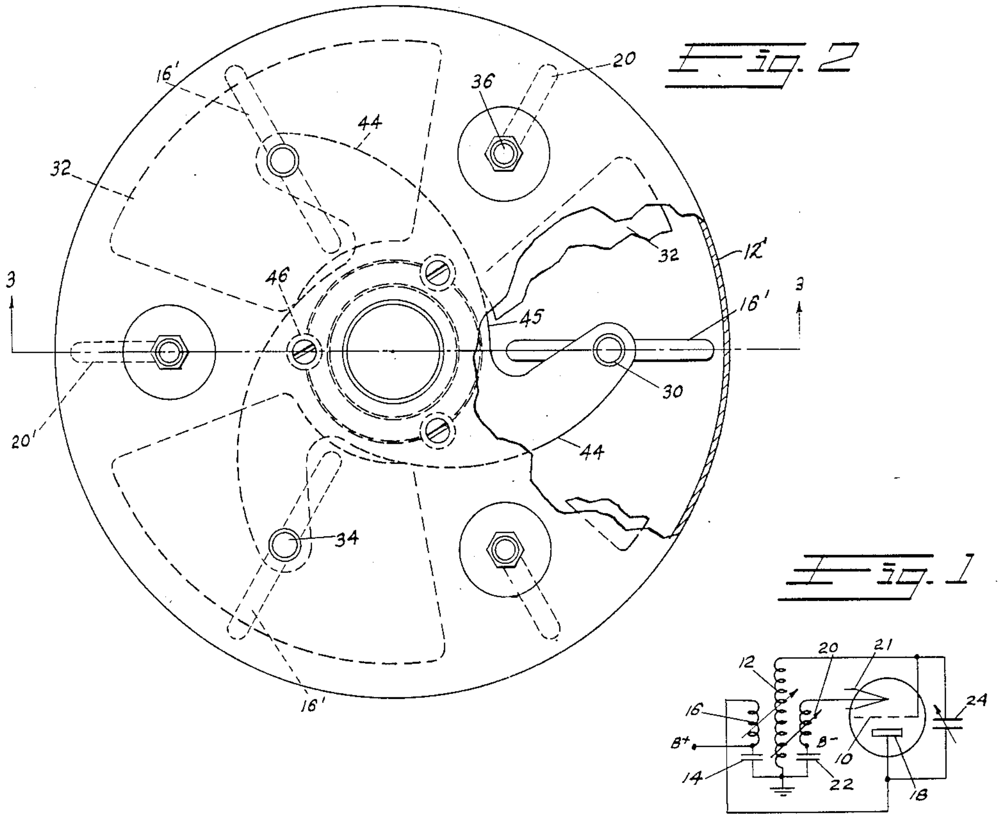
Fig. 1 is a schematic diagram of a lumped-constant analogue of the present oscillator.
Fig. 2 is a bottom plan view, partly in broken-away section, of a specific embodiment of the invention.

In Fig. 1 a triode is shown the grid 10 of which is connected to a series circuit comprising inductance 12, blocking capacitor 14 and inductance 16, the remote end of the series circuit being in turn connected to plate 18 of the triode. Inductances 12 and 16 are mutually coupled and that coupling is adjustable. A third excitation inductance 20 is provided, with adjustable mutual coupling in relation to inductance 12. Inductance 20 is connected between cathode 21 and inductance 12 through blocking capacitor 22. The interelectrode capacity between grid 10 and plate 18, together with distributed capacity of inductance elements 12, 16 and to some extent of inductance element 20, tunes the circuit to resonance at any desired frequency for which elements may be designed. Variable, lumped capacity 24 can be added to adjust this tuning slightly or to vary it cyclically or in any other manner during operation of the oscillator. The main tuning is effected by varying the mutual inductance of inductances 12 and 16. By adjusting the coupling of inductance 20 to inductance 12, the excitation can be varied.

Figure 3:
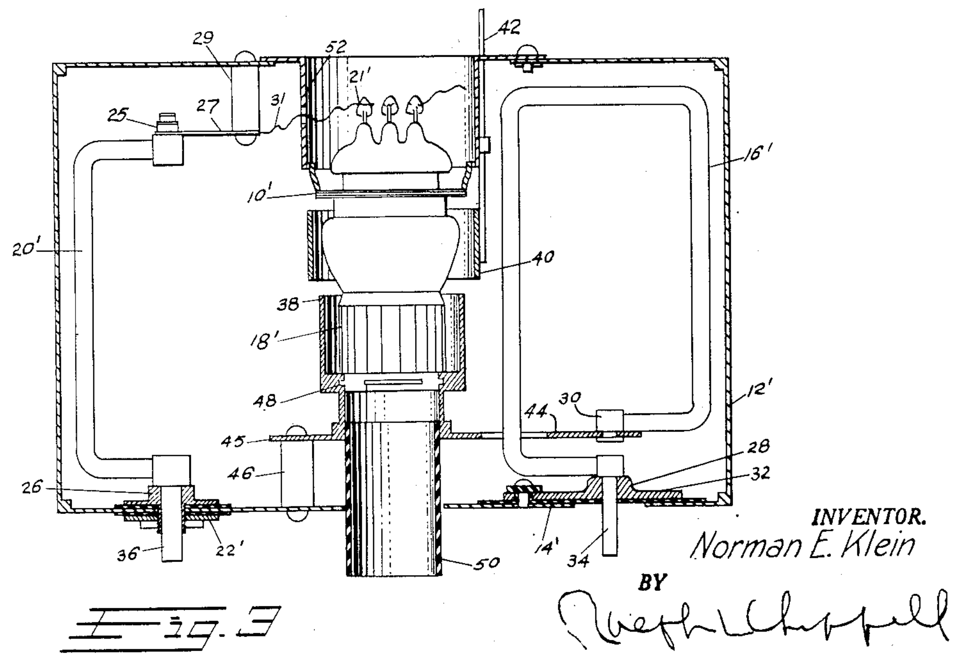
Fig. 3 is a longitudinal section taken along the line 3—3 of Fig. 2.

With this introduction, the resonator forming part of the invention as well as the entire oscillator illustrated in Figs. 2 and 3 will more readily be understood. Connected in series between grid 10′ and plate 18′ of the triode in Fig. 3 are cylindrical cavity 12′, blocking capacitor 14′ and rectangular loop or coil 16′, which coil is rotatable about a vertical axis in bearings 28 and 30. Bearing 28, supported by the bottom of cavity 12′, is extended to form a segmental plate 32, separated by mica or other suitable insulating material from the bottom of cavity 12′ to constitute the capacitor 14′. There are three coils 16′ arranged symmetrically in cavity 12′, and these are, in effect, connected in parallel. The operating shafts 34 of coils 16′ extend through bearings 28 and the bottom of the cavity and are adapted to be turned coordinately by any suitable means (not shown) such as with sprockets and a common chain, gearing, a cam and multiple followers or the like.

In the position shown, coils 16′ encircle substantially the entire flux threading cavity 12′, and there is a maximum of mutual inductance. By rotating coils 16′, they are caused, gradually, to link less and less of the flux built up in the cavity. In this way, the resonator comprising the cavity and loop or parallel loops 16′ can be tuned to progressively higher frequencies. The rotary motion involved in tuning this resonator is mechanically simpler and more compact in construction than the axially slidable shorting rings and discs generally characteristic of known resonators for comparable mean frequency and tuning range.

This resonator can be variously used, as in an R.-F. amplifier; and in such use multiple resonators can be stacked coaxially with their tuning controls ganged. This novel resonator is here used to control the frequency of a vacuum-tube oscillator, the tube being arranged coaxially of cavity 12. Excitation is developed by means of loops or inductances 20′ resembling coils 16′ when threaded by the field in cavity 12′. Three half-turn loops in the form of U-shaped bars 20′ are rotatable on the sides of the U's about vertical axes. The lower bearing 26 of each bar 20′ incorporates a blocking capacitor 22′ arranged on the bottom of cavity 12′. Each upper bearing 25 of rods 20′, is in a radial plate 27 supported by a stand-off insulator 29, and the excitation developed in each rod 20′ is applied to cathode 21′ through a flexible strip 31.

When the operating frequency is shifted, it may be desirable that the excitation should also be adjusted. For this purpose, each inductive loop 20′ has a shaft 36 extending through the bottom of cavity 12′. Three symmetrical loops 20′ as indicated in Fig. 2 can be mechanically ganged in any convenient manner for concurrent adjustment. Furthermore, it may be found expedient to couple the common drive mechanisms provided for shafts 34 and shafts 36 so that a single control can accomplish both adjustments mechanically and without exhaustive care on the part of the operator.

In order to tune the oscillator slightly in the manner of capacitor 24 (Fig. 1), a pair of rings or cylindrical members 38 and 40 (Fig. 3) are here provided, with one of the rings axially movable relative to the other. In the form shown, ring 38 is fixed while ring 40 is supported on multiple rods 42 (only one of which is shown) extending axially through the top of cavity 12′. These rods can be connected by means of a ring outside the cavity, and they can be motor-driven reciprocally at regular intervals if it should be desired to vary the oscillator frequency slightly back and forth through a range. It is apparent that numerous other forms of tunable capacitor can be provided to suit design exigencies.

Various details involved in the specific embodiment shown in the drawings are now to be described. Thus, bearings 30 are formed in the ends of three curved arms 44 (Fig. 2) which form the leads from coils 16′ to triode plate 18′. These arms are integral with a ring-like plate 45, which is supported by the bottom of cavity 12′ on standoff insulators 46. A form of bayonet socket 48 for triode plate 18′ is supported on plate 45, and this socket carries stationary capacitor ring 38. Coaxial with socket 48 and extending through the bottom of cavity 12′ is tube 50, made of insulating material. This tube forms a duct for cooling the triode.

The top of cavity 12′ is made in two parts, one of which is rigid with the cylindrical wall of the cavity and the other of which is a flanged cylinder 52, connected by spring contacts to grid 10′ and apertured for cathode leads 31, as shown. This construction simplifies insertion and replacement of the tube.

The filament supply (not shown) for the triode can advantageously be connected to the filament at two shafts 36, through respective loops 20′, provided that two leads 31 are connected to opposite filament terminals. Filament supply chokes, imperfect at best and especially imperfect for a wide tuning range, are thus eliminated. Similarly the positive plate-supply terminal can be connected at any shaft 34, and the negative plate-supply terminal can be connected to the third shaft 36, the corresponding lead 31 of which is connected to the cathode or filament centertap. The mechanism used to gang shafts 36 should insulate them apart from each other for direct-current and low-frequency alternating-current if this power supply arrangement, made possible by the circuit disclosed, is utilized. Grid bias can be realized in a conventional grid-leak circuit (not shown) which can include capacitors 22′ and can be connected between grid 10′ and B— of the plate supply.

The oscillator output can be obtained between cathode 21′ and the exterior of cavity 12′. A matching net-work for the load may then be required. Otherwise an additional adjustable loop or loops resembling rods 20′ can be provided for this purpose.

As an indication of the merit of the oscillator, in one specific model the resonator of which was 10½″ diameter and 8″ long and the frequency range of which was 80–115 megacycles, the efficiency with a 100-watt load averaged 55%.

The above specific embodiment of the invention incorporates multiple novel features mutually contributing toward excellence of the device some of these features can be eliminated, if desired or necessary without departing from the invention hereafter claimed.

Changes can be made in the above described embodiment of this invention without departing from the spirit and scope thereof.

What is claimed is:

1. An oscillator comprising a vacuum tube having a grid, an anode and a cathode, a cylindrical cavity resonator surrounding said tube, and tuning means comprising a loop rotatably mounted on an axis parallel to that of the cavity, said loop and said cavity being in a radio frequency series circuit between said grid and said anode, and a second adjustable loop within said cavity in a radio frequency circuit between said cathode and said cavity.

2. The combination in an oscillation generating system of a cavity resonator, a vacuum tube having a grid, an anode and a cathode located within said cavity, a loop located within said cavity, and tuning means comprising, said loop and said cavity being in a radio frequency series circuit between the grid and the anode of said vacuum tube, and a second loop within said cavity being in a radio frequency circuit between the cathode of said vacuum tube and said cavity.

3. The combination in an oscillation generating system of a cavity resonator, a vacuum tube having a grid, an anode and a cathode located within said cavity, and tuning means comprising a multiplicity of rotatable loops connected in parallel and located within said cavity, said loops and said cavity being in a radio frequency series circuit between the grid and the anode of said vacuum tube, and a second set of multiple rotatable loops connected in parallel and located within said cavity and being in a radio frequency circuit between the cathode of said vacuum tube and said cavity.

4. In a high-frequency oscillator including an electron-discharge tube having anode, cathode and grid elements arranged to define an axis of symmetry and wherein a space resonant system having an axis substantially collinear with the axis of said tube is disposed around said tube and is adapted to maintain ultra-high-frequency electro-magnetic oscillations therein, the combination comprising variable reactance means within the space resonant system for selectively varying the resonant frequency of said system thereby to provide tuning for said oscillator over a relatively wide range of frequency values, and independently variable reactance means including a first conductive cylindrical member coupled to said anode at one end and having the wall portion thereof in spaced coaxial relation thereto, and a second conductive cylindrical member insulatingly spaced from said elements and axially movable relative to and in telescoping relation with said first conductive member for varying the effective capacitance therewith, whereby, upon relative movement of said conductive members, relatively narrow-range tuning of said oscillator is obtained.

5. High-frequency apparatus comprising an electron-discharge tube having anode, cathode and grid elements arranged to define an axis of symmetry, means defining a space resonant system having an axis substantially collinear with the axis of said tube and adapted to maintain ultra-high-frequency electro-magnetic oscillations therein, means supporting said tube within said space resonant system in energy interchanging relation therewith, whereby said system provides tuned anode and grid circuits for said tube, a conductive member coupled to said anode and having a portion in spaced coaxial relation thereto, and a second conductive member insulatingly spaced from said elements, said second member being axially movable relative to and in telescoping relation with said conductive member for varying the effective capacitance therewith, whereby, upon relative movement of said conductive members, the frequency of said ultra-high-frequency oscillations is correspondingly altered.

6. A high-frequency frequency-modulation oscillator comprising an electron-discharge tube having anode, cathode and grid elements, means defining a space resonant system surrounding said tube and adapted to maintain high-frequency oscillation therein, means coupling said elements to said space resonant system in energy-interchanging relation therewith, whereby said system provides tunable anode and grid circuits for said tube, an adjustable cylindrical condenser arrangement coupled to said anode element within said system and actuatable from outside the system for varying the operating frequency of said oscillator, said arrangement comprising a stator member connected to said anode element and disposed coaxially therewith, and a member telescopingly movable relative to said stator member, said relatively movable member being insulatingly spaced from said elements, and means for actuating said condenser arrangement.

NORMAN E. KLEIN.

REFERENCES CITED

The following references are of record in the file of this patent:

UNITED STATES PATENTS

| Number | Name | Date |
|---|---|---|
| 2,106,771 | Southworth | Feb. 1, 1938 |
| 2,126,868 | Brown | Aug. 16, 1938 |
| 2,401,489 | Lindenblad | June 4, 1946 |
| 2,410,109 | Schelleng | Oct. 29, 1946 |
| 2,415,977 | Turner | Feb. 18, 1947 |
| 2,431,103 | Bradley et al. | Nov. 18, 1947 |
| 2,436,398 | Morton | Feb. 24, 1948 |
| 2,436,700 | Spielman | Feb. 24, 1948 |
| 2,438,832 | Turner | Mar. 30, 1948 |
| 2,442,671 | Tompkins | June 1, 1948 |
| 2,444,041 | Harrison | June 29, 1948 |
| 2,444,066 | Rostas | June 29, 1948 |
| 2,456,579 | Burnside | Dec. 14, 1948 |
| 2,458,650 | Schreiner | Jan. 11, 1949 |
| 2,465,801 | Gurewitsch | Mar. 29, 1949 |
| 2,500,875 | Schupbach | Mar. 14, 1950 |